United States Patent [19]

Kubono et al.

[11] Patent Number: 5,553,021
[45] Date of Patent: Sep. 3, 1996

[54] SEMICONDUCTOR INTEGRATED CIRCUIT DEVICE INCLUDING A VOLTAGE GENERATOR FOR PROVIDING DESIRED INTERVAL INTERNAL VOLTAGES

[75] Inventors: Shooji Kubono, Akishima; Hitoshi Kume, Musashino, both of Japan

[73] Assignees: Hitachi, Ltd.; Hitachi ULSI Engineering Corp., both of Tokyo, Japan

[21] Appl. No.: 354,623

[22] Filed: Dec. 13, 1994

[30] Foreign Application Priority Data

Dec. 17, 1993 [JP] Japan .................................. 5-344152

[51] Int. Cl.$^6$ .................................................. G11C 11/34
[52] U.S. Cl. .................................. 365/185.33; 365/206
[58] Field of Search ............................... 365/185.33, 226, 365/201; 327/536, 537

[56] References Cited

U.S. PATENT DOCUMENTS

| | | | |
|---|---|---|---|
| 4,628,487 | 12/1986 | Smayling | 365/185 |
| 4,694,314 | 9/1987 | Terada | 365/185 |
| 5,077,518 | 12/1991 | Han | 327/537 |

Primary Examiner—A. Zarabian
Attorney, Agent, or Firm—Antonelli, Terry, Stout & Kraus

[57] ABSTRACT

A semiconductor integrated circuit is provided which includes a charge pump circuit for forming a step-up (boost) voltage higher than a desired internal voltage, a voltage dividing circuit which forms a plurality of divided voltages based on a reference voltage, and a control circuit which intermittently operates the charge pump circuit so that an output voltage of the charge pump circuit provides the desired internal voltage obtained by adding a voltage obtained by multiplying a particular voltage among the plurality of divided voltages by n to a predetermined divided voltage.

12 Claims, 14 Drawing Sheets

AT ERASE

AT ERASE VERIFY

AT READ

AT PROGRAM

AT PROGRAM VERIFY

SEMICONDUCTOR INTEGRATED CIRCUIT DEVICE INCLUDING A VOLTAGE GENERATOR FOR PROVIDING DESIRED INTERVAL INTERNAL VOLTAGES

BACKGROUND OF THE INVENTION

This invention relates to a semiconductor integrated circuit device and, more particularly, to a technique effective for use in a semiconductor integrated circuit device such as a collectively erasable nonvolatile memory device (flash EEPROM (Electrically Erasable And Programmable Read-Only Memory)) having internal voltages of a plurality of types.

The flash EEPROM is a nonvolatile memory device having a capability of electrically erasing all of the memory cells of an array or only a selected block of the memory cells formed on a chip at a time. Such a flash EEPROM is described in "IEEE International Solid-State Circuits Conference," pp. 152 and 153, 1980 and "IEEE International Solid-State Circuits Conference," pp. 76 and 77, 1987, and "IEEE, J. Solid-State Circuits," Vol 23, pp. 1157 to 1163, 1988, for example.

SUMMARY OF THE INVENTION

We have developed a memory transistor having a control gate and a floating gate in which a program operation is also performed by a tunnel current and, contrary to a conventional memory transistor, a charge is injected into the floating gate to raise a threshold voltage over a select level of a word line for an erase operation. In this novel constitution, for the erase operation for the memory transistor, the threshold voltage is higher than the word line select level. Therefore, unlike the conventional memory transistor in which the charge of the floating gate is pulled out into a substrate side to lower the threshold voltage, the novel memory transistor protects other memory cells from being made unreadable by an excess erasure that puts the transistor in the depletion mode, turning on the word line although it is at the deselected level.

However, for a memory transistor such as the novel memory transistor in which a program operation is performed by the tunnel current, it is necessary to minimize the voltage which is applied to a drain of the memory transistor at a read operation, thereby preventing an erroneous erasure from being caused by the tunnel current generated by the read operation. Thus, the memory transistor in which the program operation is performed by the tunnel current requires setting an operating voltage with precision. This in turn requires a circuit for forming many types of voltages on a semiconductor integrated circuit.

It is therefore an object of the present invention to provide a semiconductor integrated circuit device having a power supply circuit capable of forming internal voltages of a plurality of types with precision and high efficiency.

It is another object of the present invention to provide a semiconductor integrated circuit device having a flash nonvolatile memory circuit permitting efficient program and erase operations.

The above and other objects, features and advantages of the present invention will become more apparent from the accompanying drawings, in which like reference numerals are used to identify the same or similar parts in several views.

In carrying out the invention and according to one aspect thereof, there is provided a semiconductor integrated circuit device having a power supply circuit comprising a charge pump circuit for forming a step-up (boost) voltage by a desired internal voltage, a voltage dividing circuit for forming divided voltages of a plurality of types based on a reference voltage, and a controlling circuit for intermittently operating the charge pump circuit such that an output voltage of the charge pump circuit becomes a voltage obtained by multiplying a particular voltage among the divided voltages by n and becomes a desired internal voltage obtained by adding predetermined divided voltages.

According to the above-mentioned constitution, a voltage obtained by multiplying the reference voltage by n is combined with a fine-adjusting voltage formed by dividing the obtained voltage, thereby efficiently forming a stable, desired voltage.

DESCRIPTION OF THE PREFERRED EMBODIMENTS

This invention will be described in further detail by way of example with reference to the accompanying drawings.

Figure 19:
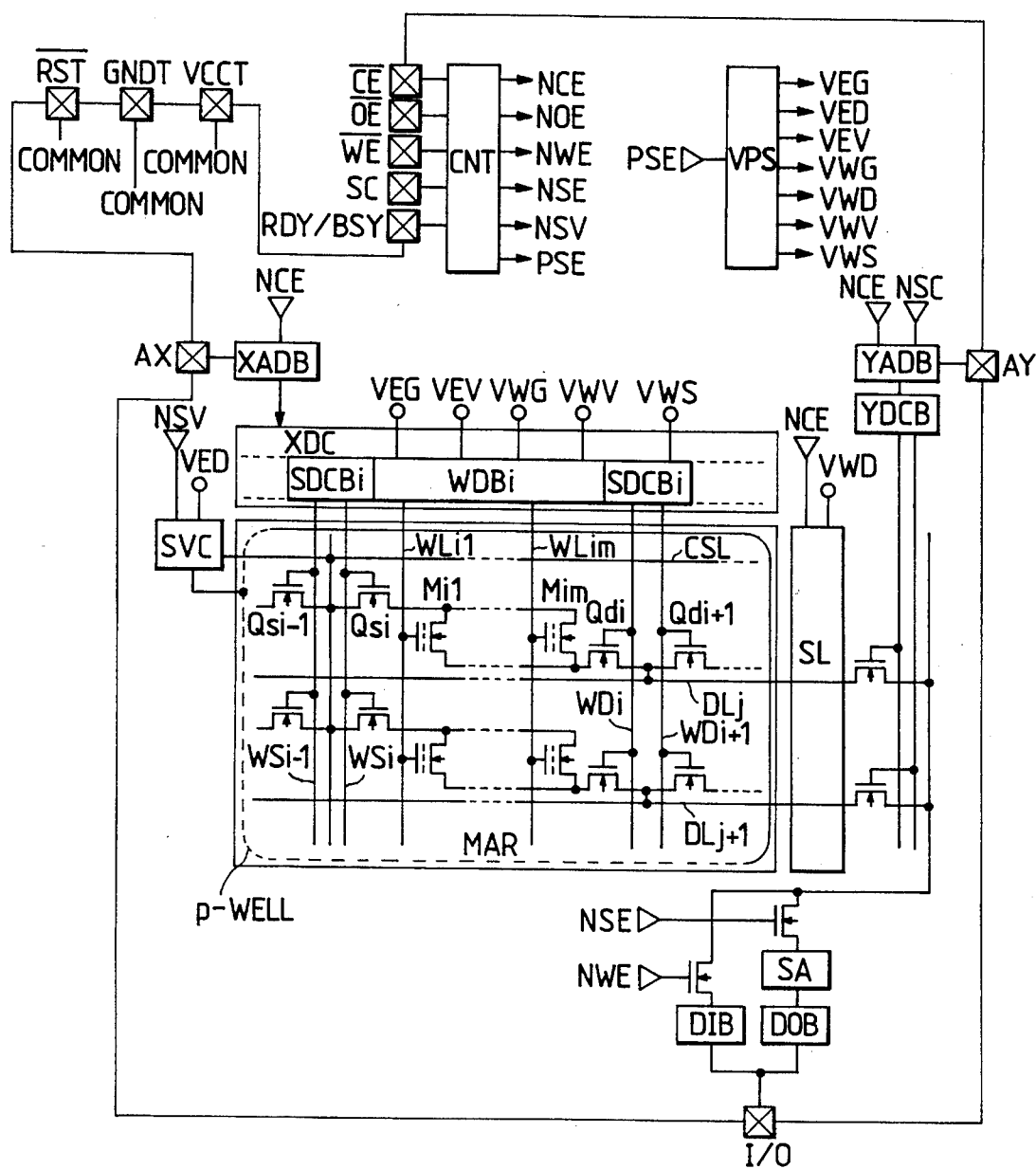
FIG. 19 is a block diagram illustrating a collectively erasable nonvolatile memory device associated with the invention and practiced as one embodiment of the invention.

FIG. 19 shows the block diagram illustrating collectively erasable nonvolatile memory device (hereinafter referred to as a flash memory) associated with the invention and practiced as one preferred embodiment thereof. For easier understanding of the invention, a memory array portion MAR is illustrated typically in a constitution of a plurality of memory cells. Each of the circuit blocks and each of the circuit elements of FIG. 19 are formed on a single semiconductor substrate such as a single silicon crystal by means of known semiconductor integrated circuit manufacturing techniques.

The flash memory according to the present invention has two power supply terminals VCCT and GNDT. The terminal GNDT is supplied with a circuit reference voltage GND (0 V for example), while the terminal VCCT is supplied with a supply voltage VCC (3 V for example) higher than the circuit reference voltage. The flash memory according to the present invention, based on the above-mentioned two voltages VCC and GND, generates internal voltages of a plurality of types with precision.

In FIG. 19, an X-address signal AX is entered in an X-address buffer XADB. The address signal captured in the X-address buffer XADB is interpreted by an X decoder SDC. Word lines Wlil through Wlim are selected by a word line select driver WDBi provided for each block composed of m memory cells. A drain common to memory cells Mil through Mim of the above-mentioned block is connected to a data line Dlj via a select MOSFET (Metal-Oxide Semiconductor Field-Effect Transistor) Qdi. A source common to the memory cells Mil through Mim of the block is connected to a common source line CSL via select MOSFET Qsi. The select MOSFET Qdi and Qsi are supplied with a select signal by a main word line select driver SDCBi.

Because potentials of the main word line Wdi to be connected to a gate of the select MOSFET and potentials of the word line Wlil through Wlim to be connected to a control gate of the memory cells are different for program, erase, and read operations, the word line select driver WDBi has output circuits for putting out select/deselect levels of voltages corresponding to the operation modes.

In the memory array MAR, a memory cell is provided at an intersection between each word line and each data line as mentioned above. However, the data line Dlj is connected to the drain of the plurality of memory cells Mil through Mim via the select MOSFET Qdi. Likewise, the source of the memory cells Mil through Mim constituting one block is connected to the source line CSL via the select MOSFET Qsi.

The data line is connected to a sense latch SL. The sense latch SL senses a high level or a low level of the data line and latches the data line to a sensed level. For a sense amplifier for the sense latch SL, a circuit generally similar to a CMOS sense amplifier such as used for a known dynamic RAM is used, but the invention is not limited thereto. Namely, the sense amplifier for the latch SL is composed of a pair of CMOS inverters with their inputs and outputs cross-connected and a power switch for supplying an operating voltage and a ground voltage to the plurality of CMOS inverters.

The sense latch SL is also used as a register for holding program data. Namely, the sense latch is connected to an input/output line via a column switch and, in a read operation, data selected by the column switch is sent via the input/output line to a serial amplifier SA and data output circuit DOB to be outputted from an input/output terminal I/O. In a program operation, program data serially entered from the input/output terminal I/O is sent to the input/output line via an input buffer DIB to be captured in the sense latch SL via the column switch, the latch SL operating as a latch circuit corresponding to the data line. When the data have all been captured, the captured data are sent to corresponding data lines simultaneously for the program operation.

The column switch is interpreted by a Y decoder YDCB that receives an output signal of a Y address buffer YADB that receives a Y address signal AY. An input/output node of the sense amplifier is connected to the input/output line by a select signal formed by the Y decoder. A column decoder has an address counter to which an initial value is set by the Y address signal AY, but the invention is not limited thereto. The address counter counts a serial clock SC to generate a continuous Y address, thereby forming a column switch select signal. The program data to be serially entered is entered in synchronization with the above-mentioned serial clock, and read data to be serially outputted is outputted in synchronization with the serial clock.

A controller CNT receives a chip enable signal /CE (it should be noted herein that a slash "/" before a signal name indicates that the signal is an active-low signal, which is conventionally represented by a bar over a signal name; in the accompanying drawing, however, the conventional bar is used for the same purpose), an output enable signal /OE, a program enable signal /WE, and the serial clock SC to generate a variety of timing signals required for internal operations.

In FIG. 19, a voltage generator VPS generates voltages necessary for erasing, writing, and reading the above-mentioned memory cells. That is, the generator VPS supplies voltages VEG, VEV, VWG and VWV to the word line select driver WDBi and a voltage VWS to the main word line select driver SDCBi. Further, the generator VPS supplies a voltage VWD to the sense latch SL and a voltage SVC to a source line voltage supply circuit SVC.

Figure 20A:
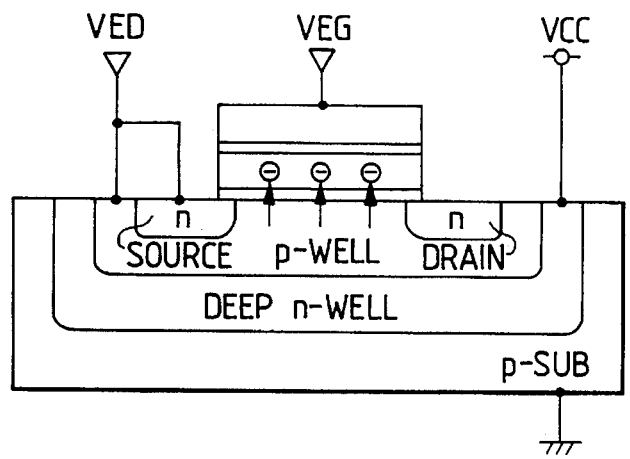
FIG. 20 (A), (B) and (C) are sectional views describing operations of the collectively erasable nonvolatile memory device of FIG. 19.
Figure 20B:
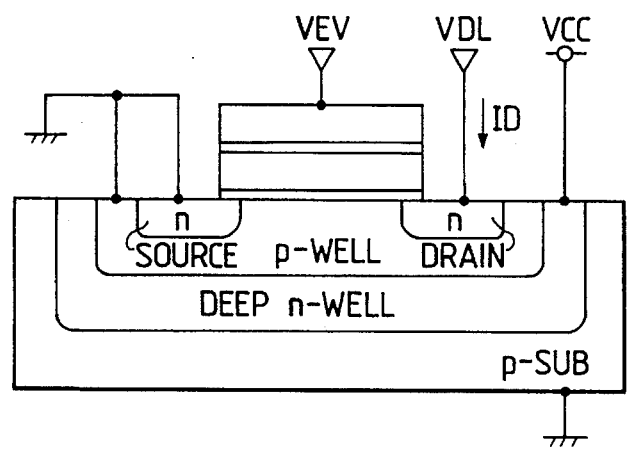
Figure 20C:
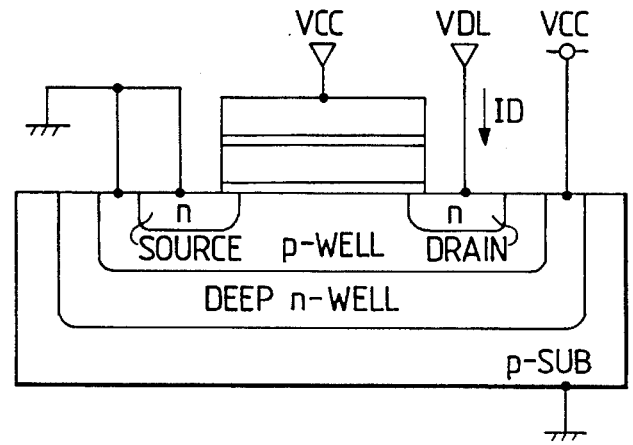

Now, referring to FIGS. 20(A), (B) and (C), there are shown sectional views for describing operations of the flash memory associated with the present invention. FIG. 20 (A) shows an erase state. Here, the flash memory has a stack gate structure with a gate insulation film between a floating gate and a semiconductor substrate made up of a thin oxide film (about 8.5 nm) so that a tunnel current flows through it. For reference, agate oxide film between the floating gate and a control gate is thicker (about 15 nm) than the above-mentioned gate oxide film. In an erase operation, VEG is applied to the control gate and VDE is applied to a source region and the substrate. This generates an electric field high enough for causing the flow of the tunnel current between the substrate and the floating gate, electrons being injected from the substrate side to the floating gate. This turns off the flash memory, in the erase state, for a select level of the word line. Meanwhile, a drain region is opened, the supply voltage VCC is applied to an n-well region that substantially provides a substrate, and the circuit ground GND such as 0 V is applied to an intrinsic substrate p-SUB.

In the memory array MAR of FIG. 19, a plurality of memory cells like Mil through Mim are collected into a single block to make the drain region and the source region common to the memory cells. The select MOSFET Qdi is provided between the common drain region and the data line DLj. The select MOSFET Qdi on the drain region side is turned off when 0 V is applied to the gate in the above-mentioned erase operation. This opens all drain regions of the memory cells Mil through Mim. The select MOSFET Qsi on the source region side is turned on when a high level ("H") is applied to the gate in the erase operation. Therefore, the above-mentioned voltage VED is given between the common source region and the substrate p-well region.

The above-mentioned constitution in which the memory cells are put into blocks, each block being connected to the data line via the select MOSFET and connected to the common source line can reduce a stress to deselected memory cells. That is, a memory cell with the word line selected and the data line deselected or a memory cell with the word line deselected and the data line selected and whose data must be retained is protected, in a program or erase operation, from being applied with the above-mentioned program or erase voltage. In this constitution, the stress is applied only to a small number of memory cells in the block.

In the above-mentioned erase operation, a negative voltage such as the VED (−4 V) is applied to the substrate p-well and the select voltage VEG such as +12 V is supplied to the word line, which makes a collective erase operation on a word line basis. In the above-mentioned embodiment, one word line provides a storage unit such as one sector. One sector consists of 512 bytes, but not limited thereto. Namely, one word line (it should be noted that one word line does not mean physically one line) is connected with 512×8=about 4K memory cells. In this case, if eight memory arrays are provided, since one word line is assigned with 512 memory cells, a word line select operation can be performed at relatively a high speed with a word driver having a comparatively small current drive capacity.

FIG. 20 (B) shows a verify state. The VEV is applied to the control gate, the VCC to the n-well region, and the VDL to the drain. Then, the circuit ground potential is supplied to the source region, the p-well region, and the substrate. If a drain current ID flows for the above-mentioned voltage VEV, its threshold voltage is determined to be lower than the voltage VEV, resulting in an insufficient erase. Therefore, the above-mentioned erase operation of FIG. 20 (A) is performed again to make the threshold voltage in the erase state greater than the VEV.

FIG. 20 (C) shows a read state. The VCC is applied to the control gate and the n-well region and the VDL is applied to the drain. The circuit ground potential is applied to the source region, p-well region, and the substrate. If the drain current ID flows for the voltage VCC, it is determined that the memory cell is in a program state; if not, it is determined that the memory cell is in an erase state. At this moment, the voltage VDL is given to the drain. The VDL is a relatively low potential as small as about 1 V, thereby preventing a soft program operation from being performed by the flowing of the tunnel current caused by the read voltage VDL and the select voltage VCC.

Figure 21A:
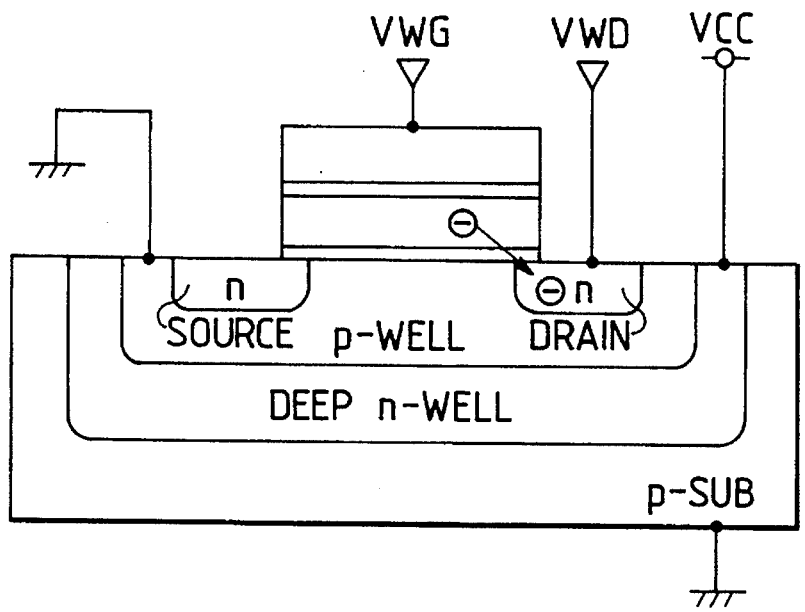
FIG. 21 (A) and (B) are sectional views describing operations of another memory transistor of FIG. 19.
Figure 21B:
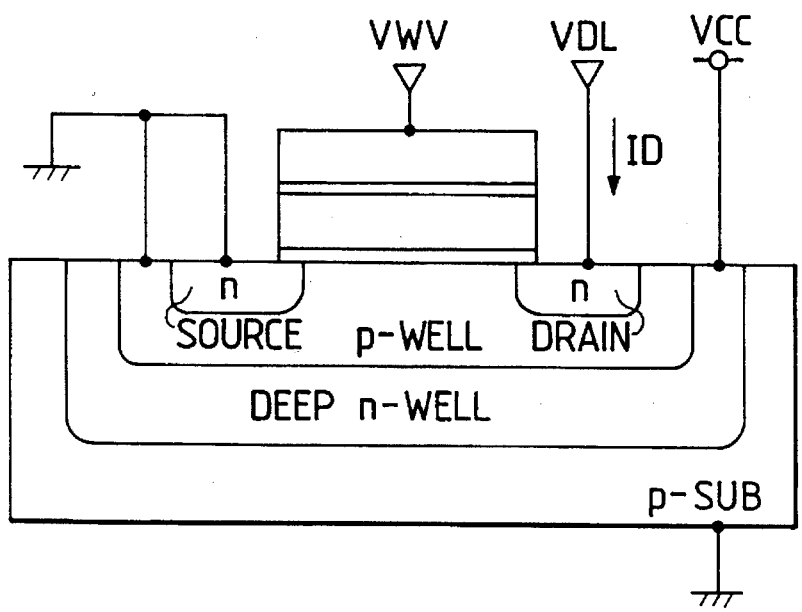

FIG. 21 (A) shows a program state. The VWG is applied to the control gate and the FWD is applied to the drain region. When no program operation is performed, 0 V is applied to the drain region. The voltage VWD of the control gate is −9.5 V and the voltage VWD of the drain region is 4.5 V. This generates an electric field high enough for flowing a tunnel current between the floating gate and the drain region, thereby charging electrons from the floating gate to the drain region. The deselected word line is set to the VCC (+3 V); therefore the tunnel current is prevented from being flowing if the drain voltage VWD of the deselected memory cell having the common drain region is given.

FIG. 21 (B) shows a program verify state. The VWV is applied to the control gate and the VDL is applied to the drain region. The circuit ground potential is given to the source region and the p-well region. If the drain current ID does not flow for the above-mentioned VWV, it is determined that its threshold voltage is higher than the voltage VWV, resulting in insufficient programming. Therefore, the program operation of FIG. 21 (A) is performed again to make the threshold voltage in the program state be lower than the VWV. Repeating the program verify operation and the program operation prevents the depletion mode from being caused by an excess programming.

Figure 1:
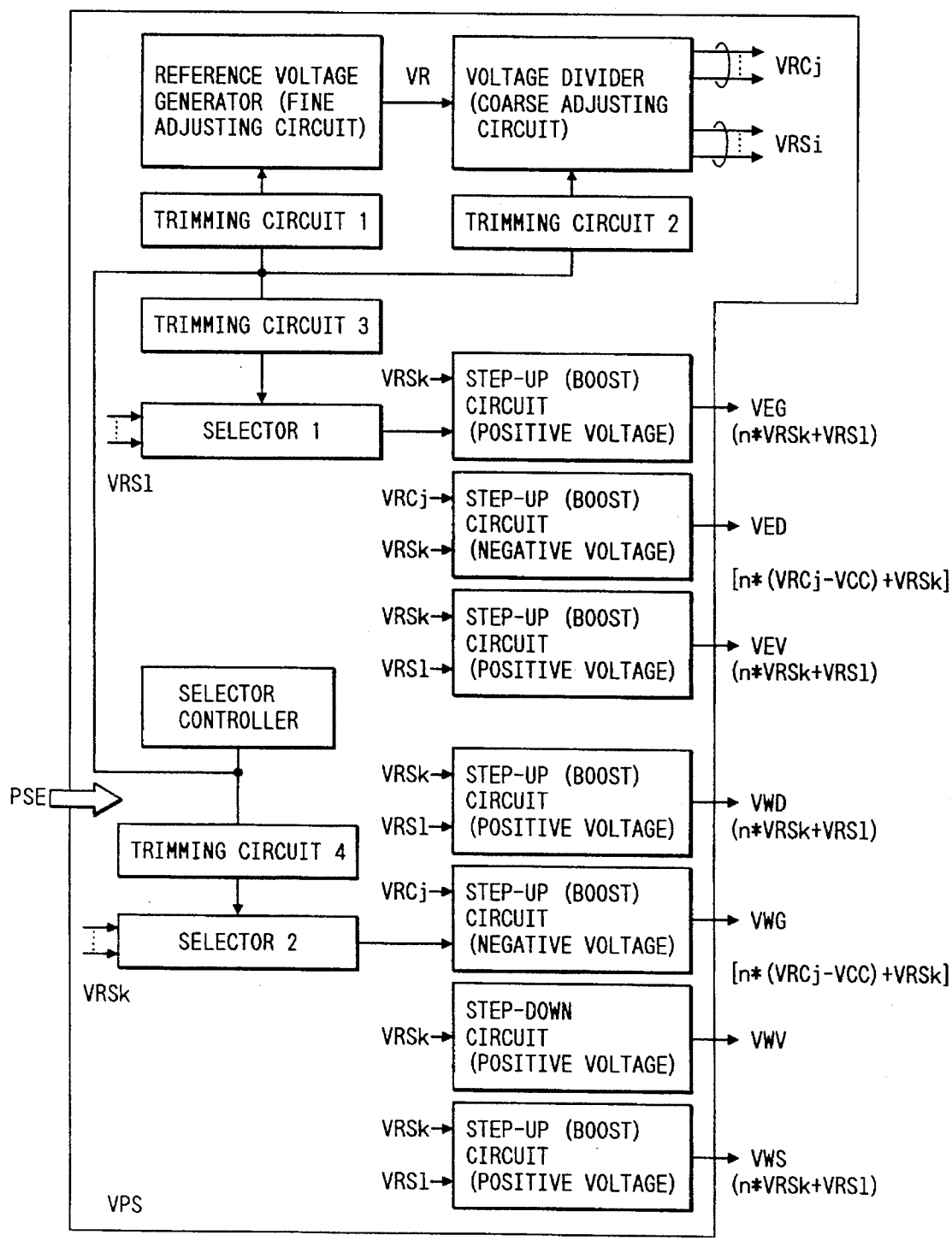
FIG. 1 is a block diagram illustrating a voltage generator practiced as one preferred embodiment of the invention.

Referring to FIG. 1, there is shown a block diagram illustrating a voltage generator VPS practiced as one preferred embodiment of the invention. This embodiment has a constitution for efficiently forming, with precision, voltages of a variety of types necessary for erasing, writing, and reading the memory cells as mentioned above.

To be more specific, a reference voltage generator generates a precision reference voltage VR (0.7 V for example) corresponding to a MOSFET threshold voltage to be described later. To obtain a desired voltage by correcting a process dispersion of the reference voltage VR, a trimming circuit 1 is provided. The trimming circuit 1 has a fuse to be described later. By selectively connecting, in parallel, MOSFETs forming the reference voltage VR, an equivalent channel width L is adjusted, thereby providing a fine adjustment of the reference voltage VR with an error of ±1%.

The reference voltage VR is sent to a divider to be divided into a variety of voltages VRCj and VRSi which are positive and negative around the reference voltage VR. Actually, this voltage divider does not divide the reference voltage VR itself but forms the voltages in increments of (0.1 V around the reference voltage VR to be described later. The voltages obtained by the divider are also trimmed by a trimming circuit 2 to be set to voltages in increments of 0.1 V against the process dispersion. The above-mentioned divided voltages VRCj are voltages with the supply voltage VCC used as reference and formed in increments of 0.1 V in a range of −0.1 V to −2.0 V around the VCC. The above-mentioned divided voltages VRSi are formed in increments of 0.1 V in a range of 0.1 V to 2.0 V around the circuit ground potential.

Of the voltages VRSi with the ground potential as a reference voltage, a plurality of voltages VRSI necessary for forming a voltage VEG are entered in a selector 1. The selector 1 selects one voltage specified by a trimming circuit 3 and supplies the selected voltage to a corresponding Step-up (boost) circuit. As will be described, the Step-up (boost) circuit is intermittently operated so that the an output voltage of a charge pump circuit becomes an output voltage VEG obtained by adding a voltage obtained by multiplying the above-mentioned selected voltage VRSl by n to a voltage obtained by selecting a VRSk from the above-mentioned voltages VRSi by connection. The selector 1 is used to select the small number of voltages VRSl necessary for forming the above-mentioned VEG from many voltages VRSi formed by the above-mentioned divider, thereby simplifying the circuitry. This constitution forms the selector 1 and the trimming circuit 3 with a minimum number of necessary circuits.

The voltage VED is formed by adding a voltage obtained by multiplying a signal selected from the divided voltages VRCj by n to a voltage selected from the divided voltages VRSi. The selection of these divided voltages is made by connection. The voltage VEV is also formed by adding the divided voltage VRSk and its n×step up voltage to the divided voltage VRSl.

Basically, voltages VWD, VWG, VWV and VWS are also formed by combinations of the above-mentioned divided voltages. However, the divided voltages VRSk used for forming these voltages are voltages specified by the selector 2 from among the plurality of voltages selected from the above-mentioned divided voltages VRSi for simplified circuits. The selector 2 selects one signal by a select signal formed by a trimming circuit 4 and outputs the selected signal.

It will be apparent that the factor n is different for each voltage to be formed and the VRSk and VRSl selected by connection to be entered in corresponding voltage generators are selected according to corresponding output voltages.

Step-up (boost) circuits and a Step-down circuit for forming voltages VEG, VED, VEV, VWG, VWV and VWS perform step-up and step-down operations based on a select signal PSE supplied from the controller CNT. That is, only a Step-up (boost) circuit or step-down transfer supplied with the select signal PSE performs the step-up or step-down operation.

Figure 2:
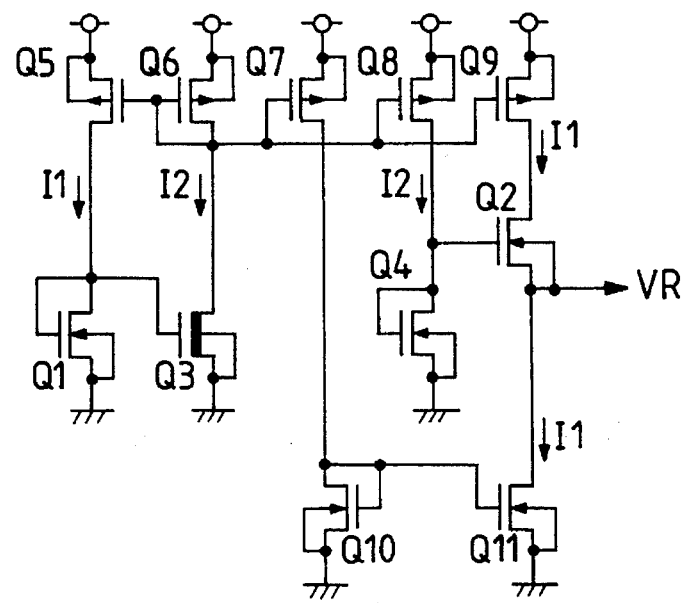
FIG. 2 is a circuit diagram illustrating a reference voltage generator of FIG. 1 practiced as one preferred embodiment of the invention.

Referring to FIG. 2, there is shown a circuit diagram of the reference voltage generator of FIG. 1. In the figure, each MOSFET indicated by an arrow pointing in a channel portion at a gate is an n-channel MOSFET, while each MOSFET indicated by an arrow pointing at the opposite direction is a p-channel MOSFET.

A MOSFET Q3 with the pointing arrow blotted black is an n-channel MOSFET in depletion mode. A current I2 that flows through the MOSFET Q3 flows to a p-channel MOSFET Q6 formed in a diode. A mirror current I1 that flows to a p-channel MOSFET Q5 in a current mirror with the p-channel MOSFET Q6 is supplied to an n-channel MOSFET Q1 formed in a diode.

The above-mentioned currents I2 and I1 are formed by the above-mentioned MOSFET Q6 and a MOSFET Q8 and a MOSFET Q9 formed in a current mirror. The current I2 is supplied to a MOSFET Q4 and the current I1 is supplied to a MOSFET Q2. A source of the MOSFET Q2 is supplied with the above-mentioned current I1 through the p-channel MOSFET Q7 and a current mirror circuit formed by n-channel MOSFETs Q10 and Q11. A source of the above-mentioned MOSFET Q4 is connected to ground potential and a gate and a drain thereof are made common, thereby forming this transistor in a diode. The gate and the drain made common are connected to a gate of the MOSFET Q2 to get the reference voltage VR from the source of the MOSFET Q2.

The reference voltage VR is output as a differential voltage (VGS4–VGS2) between a voltage VGS4 between gate and source of the MOSFET Q4 and a voltage VGS2 between gate and source of the MOSFET Q2.

The MOSFET Q1 through Q4 operates in a saturated region and the following two equations (1) and (2) are established with respect to the currents I1 and I2:

$$I1 = (1/2) \times (W1/L1) \times \beta n \times (VGS1 - Vth1)^2 \quad (1)$$
$$= (1/2) \times (W2/L2) \times \beta n \times (VGS2 - Vth2)^2$$

$$I1 = (1/2) \times (W3/L3) \times \beta n \times (VGS3 - Vth3)^2 \quad (2)$$
$$= (1/2) \times (W4/L4) \times \beta n \times (VGS4 - Vth4)^2$$

where, W1/L1 through W4/L4 are size ratios between channel width W and channel length L of MOSFET Q1 through Q4 and (βn stands for a channel conductivity of the n-channel MOSFETs. VGS1 through VGS4 are voltages between gate and source of the MOSFET Q1 through Q4 and Vth1 through Vth4 are threshold voltages of the MOSFET Q1 through Q4.

In the circuit of FIG. 2, the threshold voltages of the MOSFET Q2 and Q4 are equally set like Vth2=Vth4 and the size ratios are set as shown in equation (3) below:

$$(\alpha:1=W1/L1:W2/L2=W3/L3:W4/L4 \quad (3)$$

In the above-mentioned condition, the reference voltage VR is obtained from equation (4) as follows:

$$VR=VGS4-VGS2=\alpha^{1/2} \times (Vth1-Vth3) \quad (4)$$

As seen from equation (4), the reference voltage VR can be obtained from the size ratio α and a threshold voltage difference (Vth1–Vth3) between MOSFETs Q1 and Q3. In other words, when making different the threshold voltages of the MOSFET Q1 and Q3 by ion implantation or the like, a resulting process dispersion is corrected by adjusting the size ratio α. Consequently, the MOSFETs Q1, Q2, Q3 and Q4 are formed as follows:

Generally, channel lengths L of MOSFETs are the same. A conductance of a particular MOSFET is set by varying its channel width W. Therefore, if the channel widths W2 and W4 or substantial sizes of the MOSFETs Q2 and Q4 are set to 1, a desired reference voltage VO is provided by adjusting the sizes of the MOSFETs Q1 and Q3. For this reason, the MOSFETs Q1 and Q3 are represented in one MOSFET in FIG. 2; actually, however, a plurality of MOSFETs are formed on the semiconductor substrate, in which the number of MOSFETs to be arranged in parallel is determined by a switch MOSFET to be switch-controlled by a control voltage formed by a programming device such as the fuse constituting the trimming circuit 1 of FIG. 1.

When correcting the process dispersion of (Vth1–Vth3), the number of adjusting MOSFETs to be arranged in parallel may be set to a fixed MOSFET by a control signal such as the above-mentioned fuse. To do so, it is required for the MOSFETs Q1 and Q3 to form beforehand the fixed MOSFET having channel widths W1 and W3 slightly smaller than those of the MOSFETs Q2 and Q4 and the plurality of adjusting MOSFETs having a channel width minute enough for correcting the process dispersion.

The above-mentioned equation (4) indicates that a differential voltage such as (Vth1–Vth3) can be amplified by $\alpha^{1/2}$. Therefore, setting the channel widths of the MOSFETs Q1 and Q3 to a value greater than those of the MOSFETs Q2 and Q4 by α provides the reference voltage VR amplified by $\alpha^{1/2}$. To do so, the fixed MOSFET sized by a basic factor of α may be connected with small-sized MOSFETs for correcting the above-mentioned process dispersion selectively arranged in parallel by a control signal formed by the programming device such as the fuse constituting the above-mentioned trimming circuit 1.

Figure 3:
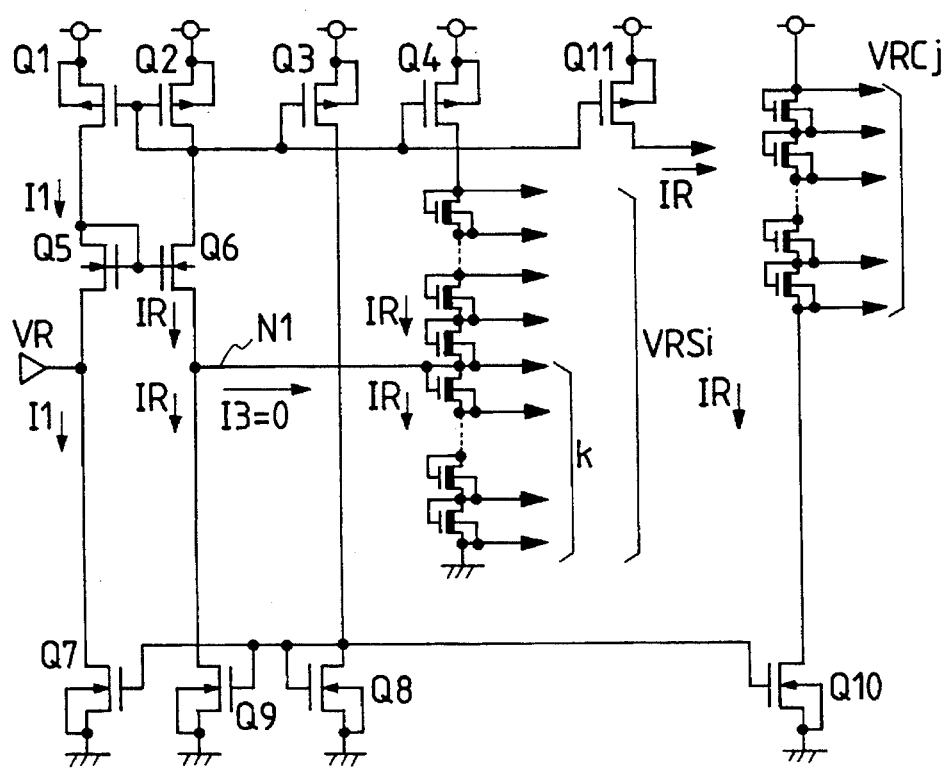
FIG. 3 is a circuit diagram illustrating a voltage divider of FIG. 1 practiced as one preferred embodiment of the invention.

Referring to FIG. 3, there is shown a circuit diagram of the voltage divider of FIG. 1. In the figure, some of circuit symbols assigned to the MOSFETs are the same as those used in FIG. 2 for easier reading. However, it should be noted that each symbol in FIG. 3 represents a separate circuit function. This holds true with other circuit diagrams.

An n-channel MOSFET Q5, with its gate and drain connected, is formed into a diode. For this MOSFET Q5, an n-channel MOSFET Q6 with its gate connected to the gate of the MOSFET Q5 is provided. As compared with the MOSFET Q5, the MOSFET Q6 is larger in size ratio (W/L) and has a current amplifying function corresponding to the size ratio.

The MOSFET Q5 is provided at its source and drain with a current source for flowing a current I1 formed by a current mirror circuits composed of p-channel MOSFETs Q2 and Q1 and n-channel MOSFET Q9 and Q7. The MOSFET Q6 is provided at its source with a constant current source for flowing a current IR corresponding to the above-mentioned size ratio, and at its drain with a MOSFET Q2 constituting the above-mentioned current mirror circuit.

The reference voltage VR formed by the reference voltage circuit of FIG. 2 is supplied to the source of the above-mentioned MOSFET Q5. An output voltage VN1 is obtained from the source (node N1) of the MOSFET Q6. Making the size ratio (W5/L5:W6/L6) of the MOSFETs Q5 and Q6 a current ratio I1:IR makes equal voltages between gates and sources of the MOSFETs Q5 and Q6, there by providing VR=VN1. This in turn provides the output voltage source VN1 that outputs the same voltage as the input reference voltage VR.

The current IR is flowed from the MOSFET Q4 by the current mirror circuit. The current IR is then supplied to depletion-type MOSFETs arranged in series to operate as a resistance element. These depletion-type MOSFETs are commonly connected at their gates and drains. When the current IR is flowed through the MOSFET Q6 by the MOSFETs Q3, Q8 and Q9, no current flows through the output node N1 of the MOSFET Q6 and k series depletion-type MOSFET circuits, thereby permitting to apply the reference voltage VR to the k MOSFETs.

The above-mentioned constitution provides divided voltages in VR/k step by outputting divided voltages from the k MOSFETs. Based on the above-mentioned reference voltage VR, the supply voltage side can provide a level-shifted voltage to be raised in the VR/k step. If the total number of the above-mentioned series MOSFETs is j, a maximum voltage will be (j/k)VR. Varying the total number can simultaneously adjust a plurality of divided voltages as a whole. The trimming circuit 2 of FIG. 1 is used to adjust the number of the series MOSFETs k.

The current IR formed as described above flows to depletion-type MOSFETs arranged in series on the supply voltage VCC side through a current mirror MOSFET Q10. This provides a divided voltage VRCj based on the supply voltage VCC.

Figure 4:
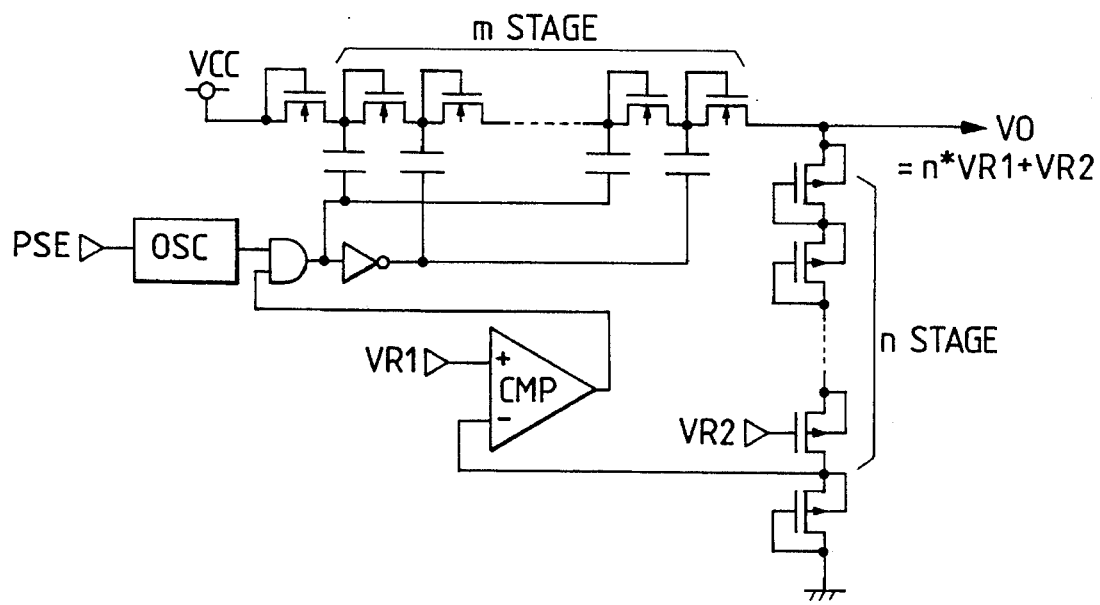
FIG. 4 is a circuit diagram illustrating a power supply circuit of FIG. 1 practiced as one preferred embodiment of the invention.

Referring to FIG. 4, there is shown a circuit diagram illustrating the power supply circuit of FIG. 1 practiced as one preferred embodiment of the invention. This circuit generates a positive voltage such as the voltage VEG of FIG. 1. A charge pump circuit consists of m stages to form a step-up voltage so that an output voltage VO is slightly higher than a desired voltage. The charge pump circuit is supplied with a pulse generated by an oscillator OS through a gate circuit. Controlling this gate circuit by an output of a voltage comparator CMP permits intermittently operating the charge pump circuit.

The oscillator OSC is controlled by the control signal PSE, but not limited thereto. For example, if the above-mentioned flash memory on which the voltage generator is mounted is in standby mode or read mode in which the output voltage VO is not required, the oscillator OSC itself is stopped from operating by the control signal PSE, thereby realizing power saving.

A total number of n p-channel MOSFETs formed in diode connections (hereinafter referred to as diode MOSFETs) and one p-channel MOSFET are connected in series between an output terminal of the charge pump circuit and the ground potential. Of these diode MOSFETs, a source voltage of a MOSFET provided on the ground potential side is supplied to an inverted input (−) of the voltage comparator CMP. A non-inverted input (+) of the comparator CMP is applied with the above-mentioned reference voltage VR1. This reference voltage VR1 is selected by the trimming circuit 1 from among the voltages formed by the above-mentioned voltage divider or selected by circuit connection. The voltage VR1 is higher than a threshold voltage of the above-mentioned diode MOSFETs. A gate of the above-mentioned one p-channel MOSFET is applied with a voltage VR2 for fine adjustment. The fine-adjusting voltage VR2 is higher than the voltage VR1 in order to secure an operating voltage of the MOSFET provided on the ground potential. side. That is, as shown in FIG. 3, when seen from the circuit ground potential, the voltage VR2 is a divided voltage formed by k or more MOSFETs.

When no current flows through the above-mentioned diode MOSFETs arranged in series, an output signal from the voltage comparator CMP goes high, upon which an oscillation pulse is sent from the oscillator OSC, to the charge pump circuit, starting a step-up operation. When a resulting step-up voltage causes a current to flow through the above-mentioned series of diodes to make a source voltage of the MOSFET provided on the ground potential side reach the above-mentioned voltage VR1, the output of the voltage comparator CMP is inverted to close the gate circuit. This stops charge-pumping operation and keeps the state. At this moment, a voltage between the source and gate of the MOSFET on the ground potential side is equal to the reference voltage VR1. Therefore, because the voltage VR2 is applied to the gate to cause the same current to flow through the n MOSFETs including the above-mentioned one p-channel MOSFET, voltages between the gates and sources become equal, resulting in a voltage of n×the voltage VR1. And because the gate of one MOSFET is applied with the fine-adjusting voltage VR2, the voltages between the gates and sources of the n MOSFETs provide a voltage such as n×VR1+VR2. In FIG. 4, the multiplication sign (×) is represented by an asterisk (*). Namely, when the output voltage VO becomes n×VR1+VR2, the charge pump circuit stops charge-pumping; when the output voltage drops from the voltage n×VR1+VR2, the charge pump circuit starts charge-pumping. The voltage n×VR1+VR2 is formed by this intermittent charge pump operation.

Figure 5:
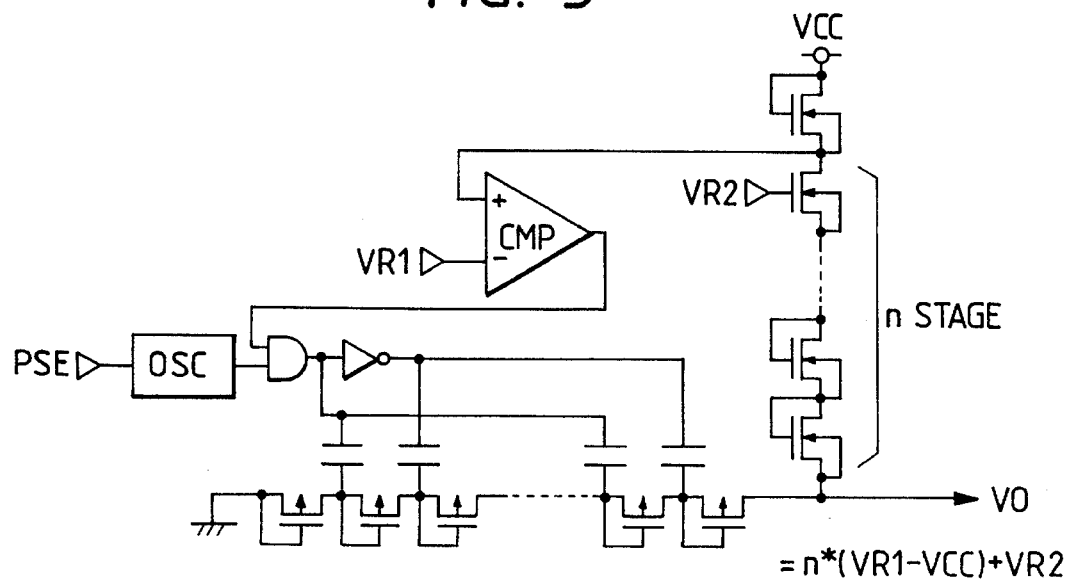
FIG. 5 is a circuit diagram illustrating the power supply circuit of FIG. 1 practiced as another embodiment of the invention.

Referring to FIG. 5, there is shown a circuit diagram of the power supply circuit of FIG. 1 practiced as another embodiment of the invention. This embodiment forms a negative voltage such as the voltage VWG of FIG. 1. A charge pump circuit consists of a plurality of stages like the charge pump of FIG. 4 and forms a step-up voltage so that an output voltage VO is slightly higher in an absolute value than a desired voltage. The charge pump circuit is applied with a pulse generated by an oscillator OSC through a gate circuit. Controlling the gate circuit by an output of a voltage comparator CMP permits to operate the charge pump circuit intermittently.

A total number of n n-channel MOSFETs formed in diodes and one n-channel MOSFET are connected in series between an output terminal of the charge pump circuit and the ground potential. Of these diode MOSFETs, a source voltage of a MOSFET provided on the ground potential side is supplied to an non-inverted input (+) of the voltage comparator CMP. An inverted input (−) of the comparator CMP is applied with the above-mentioned reference voltage VR1. This reference voltage VR1 is selected by the trimming circuit 1 from among the voltages formed by the above-mentioned voltage divider or selected by circuit connection. The voltage VR1 is a voltage higher than a threshold voltage of the above-mentioned diode MOSFETs, relative to the supply voltage VCC. A gate of the above-mentioned one MOSFET is applied with a VR2 for fine adjustment. This fine-adjusting voltage VR2 is a fine-adjusting voltage formed by voltage divider of FIG. 1 as compared to a voltage set by the n MOSFETs in increments of n states. In this embodiment, a voltage obtained by adding voltage n×(VR1−VCC) to the fine-adjusting voltage VR2, relative to the supply voltage VCC, can also be formed.

Figure 6:
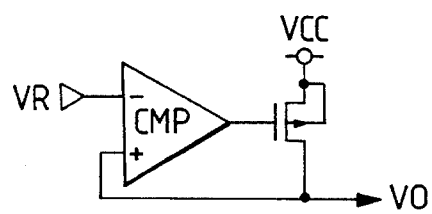
FIG. 6 is a circuit diagram illustrating the power supply circuit of FIG. 1 practiced as still another embodiment of the invention.

Referring to FIG. 6, there is shown a circuit diagram of the power supply circuit of FIG. 1 practiced as still another embodiment of the invention. FIG. 6 shows an impedance converting circuit from which the input voltage VR is outputted without change. This converter is used in a circuit for forming the voltage VWV of FIG. 1. The input voltage VR is applied to an inverted input (−) of a voltage comparator CMP composed of a differential circuit. A resulting output voltage is applied to a gate of an n-channel output MOSFET to obtain an output voltage VO at its source. The obtained output voltage is fed back to a non-inverted input (+) of the CMP. This constitution controls a gate voltage of the output MOSFET so that the output voltage VO matches the input voltage VR, thereby performing impedance conversion through this output MOSFET of source follower type.

Figure 7:
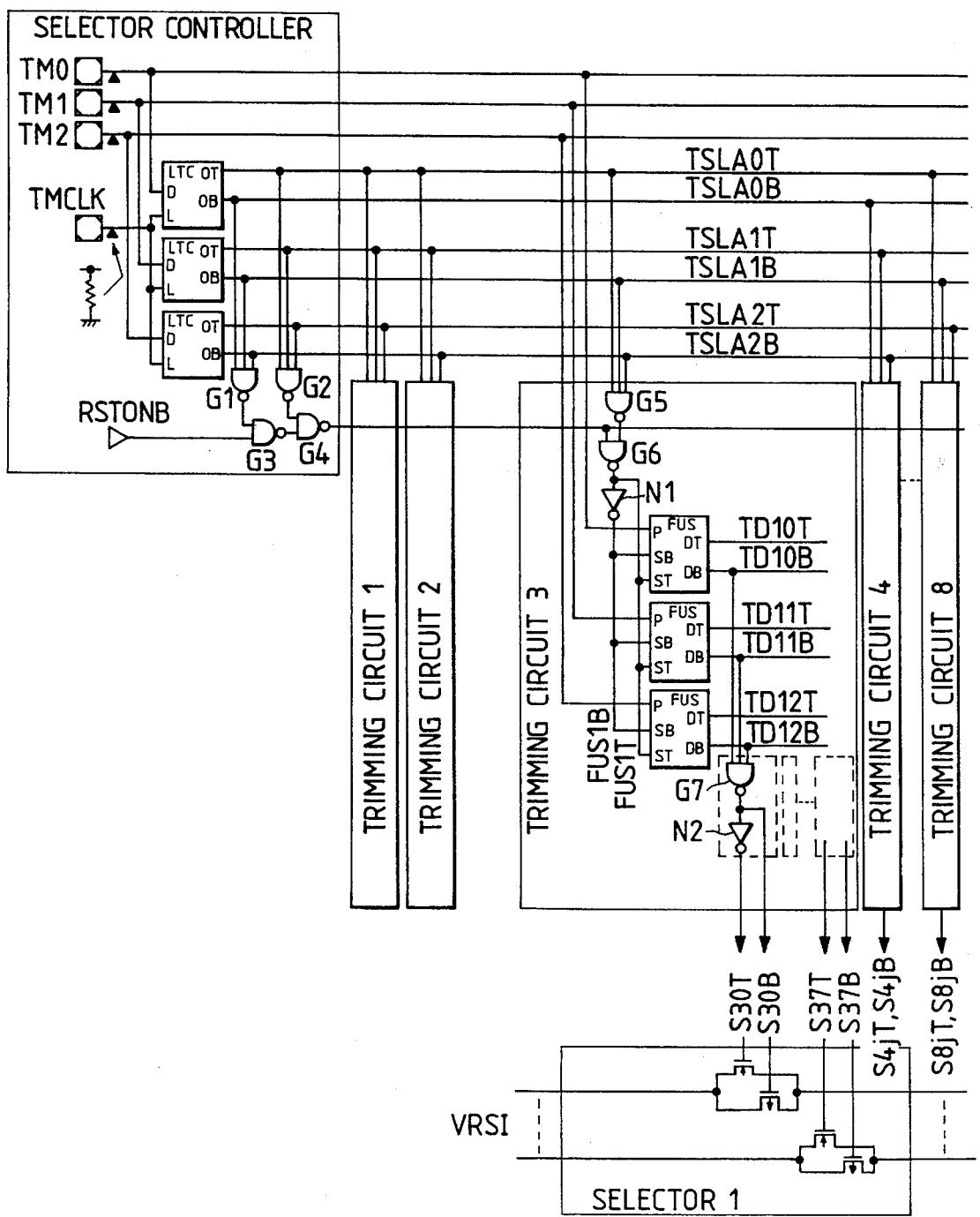
FIG. 7 is a circuit diagram illustrating a selector control circuit, trimming circuits, and a selector circuit practiced as one preferred embodiment of the invention.

Referring to FIG. 7, there is shown a circuit diagram of the selector control circuit, the trimming circuit, and the selector of FIG. 1 practiced as preferred embodiments of the invention. The selector control circuit is provided with electrodes TM0, TM1, and TM2 having both a capability of specifying one of the trimming circuits and a capability of entering a fuse blow signal on a pseudo basis. Each of these electrodes TM0 through TM3 is provided with a pull-down resistor represented in a black triangle, thereby keeping the electrode normally at low level.

Figure 8:
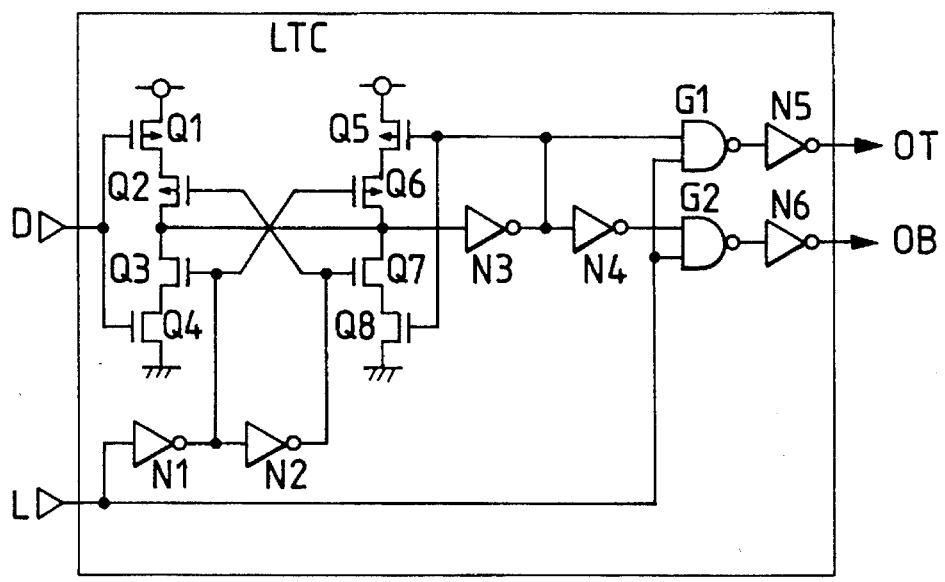
FIG. 8 is a circuit diagram illustrating a latch circuit of FIG. 7 practiced as one preferred embodiment of the invention.

A selector specifying signal entered at each of the electrodes TM0 through TM2 is captured in each latch circuit LTC. When a signal coming from an electrode TMCLK is low, the latch LTC passes the input signal captured at an input terminal D as shown in FIG. 8; when the above-mentioned signal is high, the latch holds the above-mentioned captured signal.

That is, in a probing process or the like, the electrode TMCLK is held low and the signal for specifying up to six selectors is supplied by the electrodes TM0 through TM2 to make the electrode TMCL high, which is held in the latch circuit LTC. By the above-mentioned 3-bit signal, up to eight selectors can be specified. However, when all three bits are zeros, it indicates an all reset state; when all three bits are ones, the signal is used to inhibit pseudo trimming in hold state.

Figure 10:
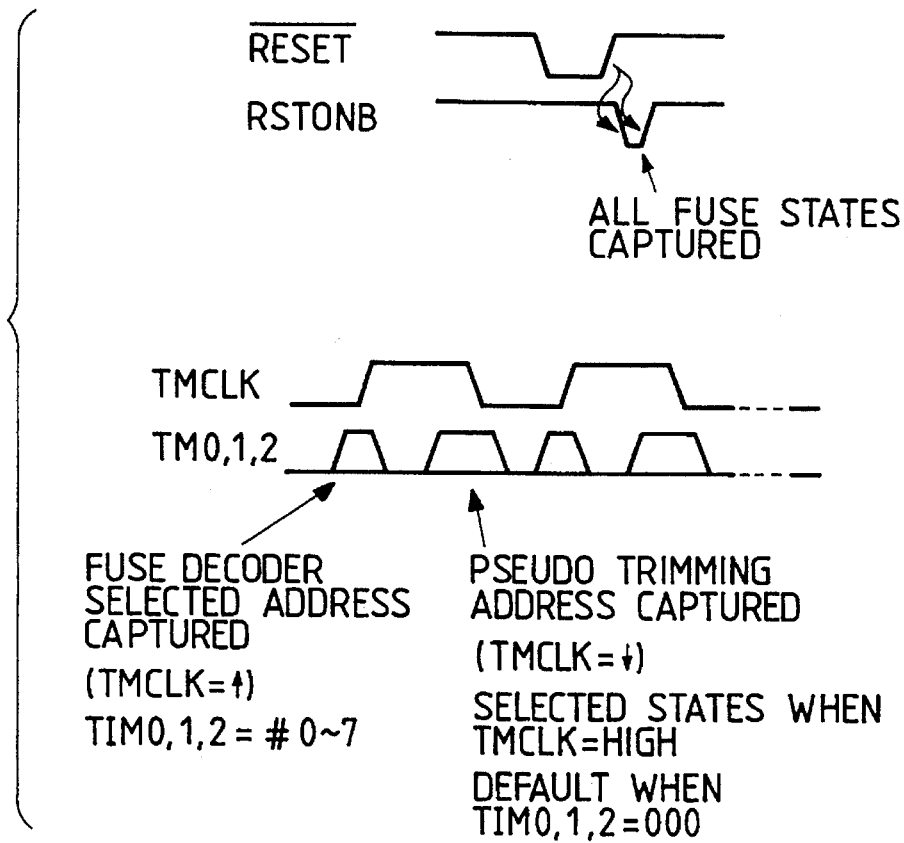
FIG. 10 is a timing chart describing operations of the circuits of FIG. 7.

As shown in a timing chart of FIG. 10, when the TMCLK rises, fuse decoder select addresses MT0 through MT2 for specifying one of the trimming circuits are captured in the latch circuits LTC. This causes the selector control circuit to form a select signal for selecting one of the trimming circuits and puts the pseudo blow signal composed of the signals TM0 through TM2 into a fuse circuit FUS in which the pseudo blow signal is held in a latch circuit. Subsequently, the TMCLK is turned low, a next fuse decoder select address is entered, the entered address is held in the latch circuit, and blow information corresponding to the held address is entered. When a reset signal /RESET supplied to a reset terminal RST goes from low to high, a signal RSTONB goes low for a certain period of time in which the fuse is blown and corresponding fuse information is latched. Because the internal signal /RESET goes low when the power is turned on, the circuit is initialized.

Figure 9:
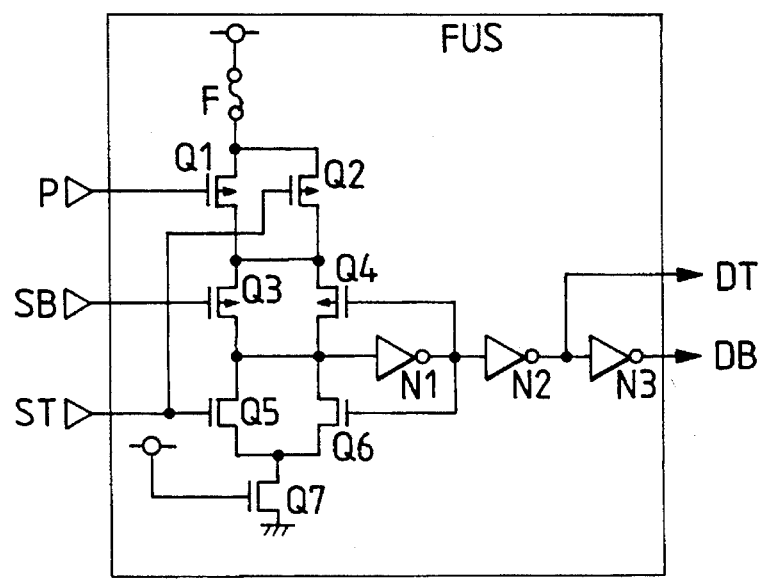
FIG. 9 is a circuit diagram illustrating a fuse circuit of FIG. 7 practiced as one preferred embodiment of the invention.

Referring to FIG. 9, there is shown a circuit diagram of the fuse circuit practiced as one embodiment of the invention. A fuse F is provided on the supply voltage VCC side. At another side of the fuse F, a p-channel MOSFET Q1 for pseudo blow and a p-channel MOSFET Q2 for normal operation are arranged in parallel. At other sides of these MOSFETs Q1 and Q2, sources of a p-channel MOSFETs Q3 and Q4 are connected. Drains of the MOSFETs Q3 and Q4 are connected to drains of n-channel MOSFETs Q5 and Q6. The drains of these MOSFETs Q3 through Q6 are commonly connected to provide an output node. Between the n-channel MOSFETs Q5 and Q6 and circuit ground potential, an n-channel MOSFET Q7 functioning as a high resistance element is provided. The supply voltage VCC is regularly applied to a gate of the MOSFET Q7.

A timing pulse ST for reading whether the fuse F has been blown or not is supplied to a gate of the n-channel MOSFET Q5 and a gate of the p-channel MOSFET Q2. The timing pulse ST is also supplied to a gate of the p-channel Q3 as an inverted signal SB via an inverter, not shown. A potential at the above-mentioned output node is entered in an inverter N1. An output signal from this inverter N1 is fed back to a gate of the p-channel MOSFET Q4 on one hand and to a gate of the n-channel MOSFET Q6 on the other hand. The output signal of the inverter N1 is supplied to inverters N2 and N3. A signal DT is outputted from the inverter N2 and an inverted signal DB is outputted from the inverter N3.

When the timing pulse ST is turned high, the MOSFETs Q5 and Q3 are turned on and the MOSFET Q2 is turned off. At this moment, a pseudo blow signal is low and the MOSFET Q1 is on. If the fuse F has not been blown, a high-level signal is put in the inverter N2 because a resistance value of the MOSFET Q5 is larger than that of the fuse F. The output signal of the inverter N1 goes low to turn on the p-channel MOSFET Q3, thereby effecting latching. At this moment, the n-channel MOSFET Q6 is turned off by the low-level output signal of the inverter N1, thereby preventing a direct current from flowing into the fuse F. When the above-mentioned read operation has been completed, the timing pulse ST goes low and both the MOSFETs Q3 and Q5 are turned off.

If the fuse F is blown when the timing pulse ST is high, the low-level signal is put in the inverter N1 by the MOSFET Q7 in the on state. This makes high the output signal of the inverter N1 to turn on the n-channel MOSFET Q5, thereby effecting latching. The high-level signal of the inverter N1 turns off the p-channel MOSFET Q4. Even if a leak current is to flow with a high resistance value although the fuse F has been blown, power saving can be effected because the MOSFET Q3 is off.

To effect a pseudo blown state, the signal P is turned high. This prevents a current pulse from being formed in the state in which the fuse F is not blown, so that the input to the inverter N1 is set to low, which can be held.

Figure 11:
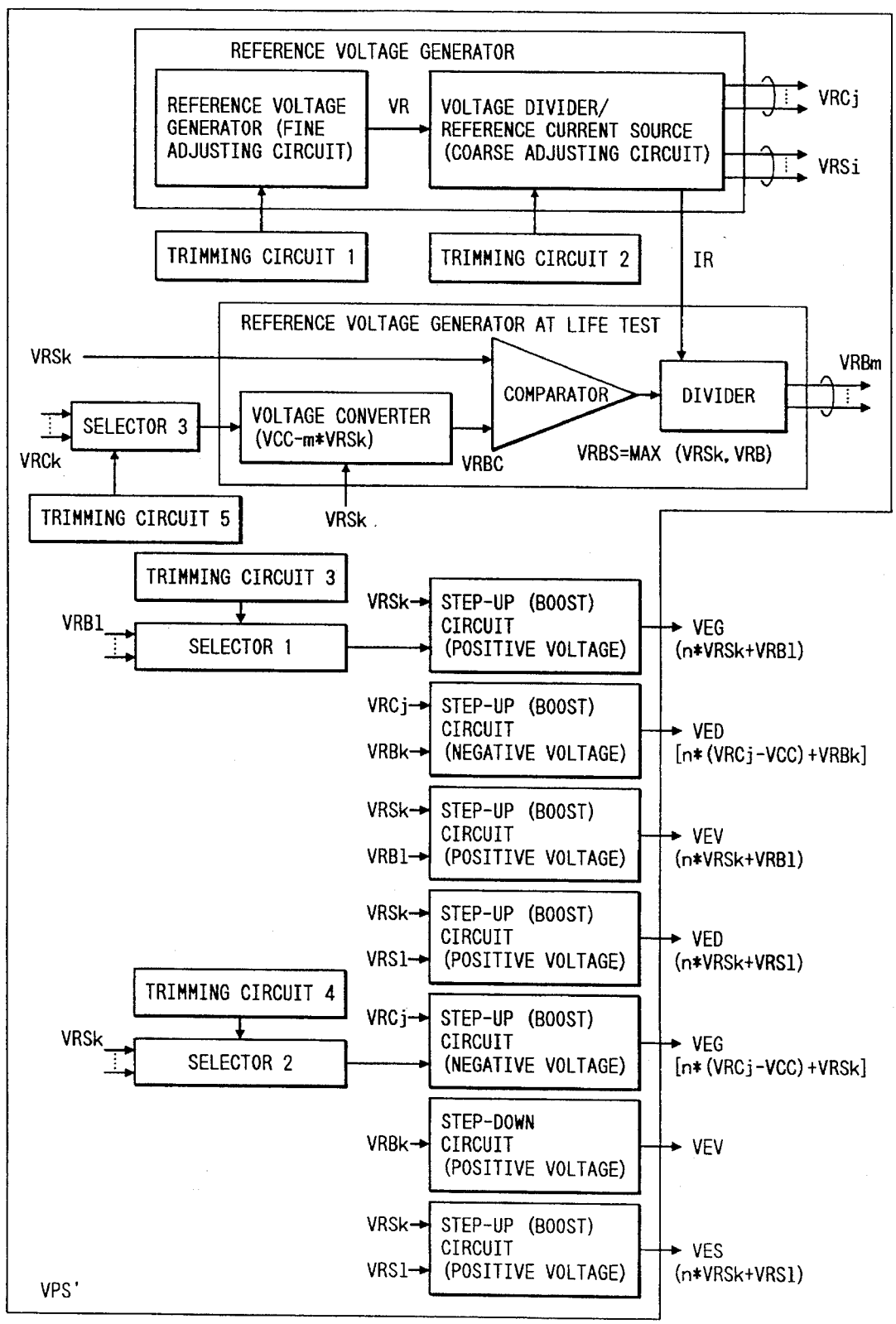
FIG. 11 is a block diagram illustrating the voltage generator associated with the invention and practiced as another preferred embodiment thereof.

Referring to FIG. 11, there is shown a block diagram illustrating the voltage generator associated with the invention and practiced as another embodiment thereof. In this embodiment, a high voltage in proportion to a rise in the supply voltage VCC is generated for a life test to perform troubleshooting of initial faults. In this case, relative voltages between control gate and channel and between control gate and gate must be the same as in normal operation for writing data to a memory cell or erasing data from it, the relative voltages are composed of voltages made higher in proportion to the supply voltage VCC and voltages made constant regardless of the supply voltage.

In the embodiment of FIG. 11, a voltage generator VPS' is obtained by adding a reference voltage generator for life testing to the reference voltage generator of FIG. 1. A voltage converter forms a voltage VRBC relative to the supply voltage VCC. A selector 3 selects, by means of a trimming circuit 5, divided voltages VRCk from among divided voltages VRCj formed relative to the supply voltage VCC and sends the selected divided voltages to the voltage converter, the number of the divided voltages VRCk being smaller than the number of the divided voltages VRCj.

Figure 12:
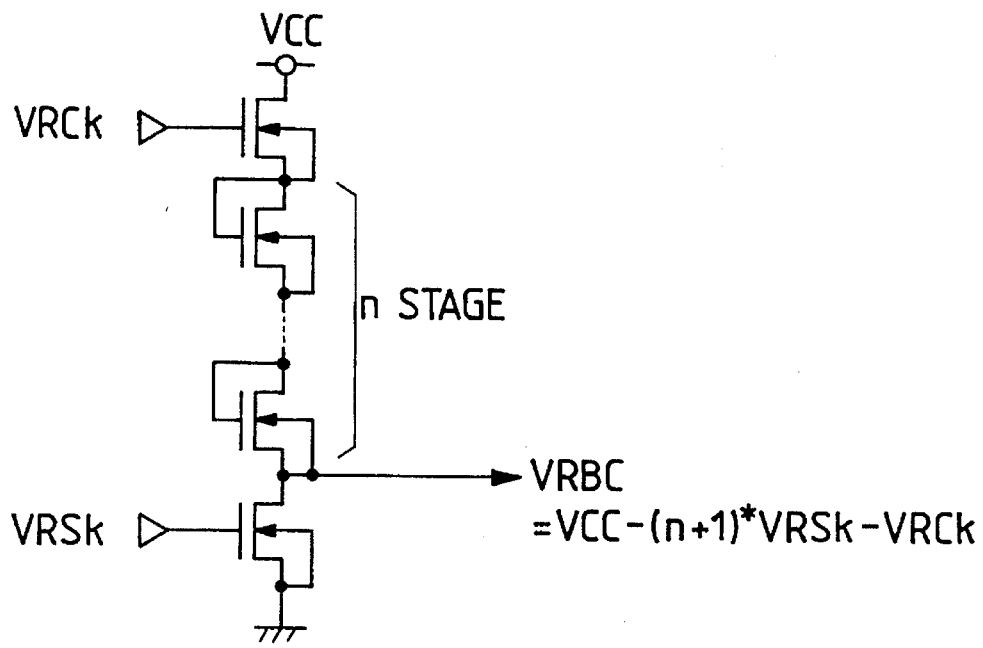
FIG. 12 is a circuit diagram illustrating a voltage converter of FIG. 11 practiced as one preferred embodiment of the invention.

Referring to FIG. 12, there is shown an actual circuit diagram of the above-mentioned voltage converter. As shown in the figure, the voltage converter is composed of an n-channel MOSFET supplied at its gate with a reference voltage VRSk selected by connection, n n-channel MOSFET diodes connected in series with the above-mentioned n-channel MOSFET, and a MOSFET provided between the other end of the above-mentioned n-channel MOSFET and the supply voltage VCC and applied at its gate with the voltage VRCk coming from the selector 3. These MOSFETs are all equal in size. The voltage converter sends out an output voltage VRBC from a drain of a MOSFET provided on the ground potential side of the above-mentioned circuit.

This voltage converter operates as follows. First, the MOSFET applied at its gate and source with the reference voltage VRSk flows a reference current, which also flows into the MOSFETs arranged in series, thereby making equal voltages of the gates and sources of the n diode MOSFETs to the above-mentioned reference voltage VRSk. Since the reference voltage VRCk that varies according to the supply voltage VCC is applied to the gate of the MOSFET on the supply voltage side, a voltage level-shifted by voltages between gates and sources of the n+1 MOSFETs relative to the reference voltage VRCk is outputted. Because the current formed by the MOSFET applied at its gate and source with the reference voltage VRSk flows in each of the above-mentioned MOSFETs, the output voltage VRBC is a voltage obtained by VCC−(n+1)×VRSk−VRCk.

In FIG. 11, the voltage VRBC that varies with the supply voltage VCC is supplied to comparator. The comparator is applied at the other input with the reference voltage VRSk. The comparator does not perform a voltage comparing operation in a normal sense but selects the higher of the two voltages and outputs the selected voltage.

Figure 13:
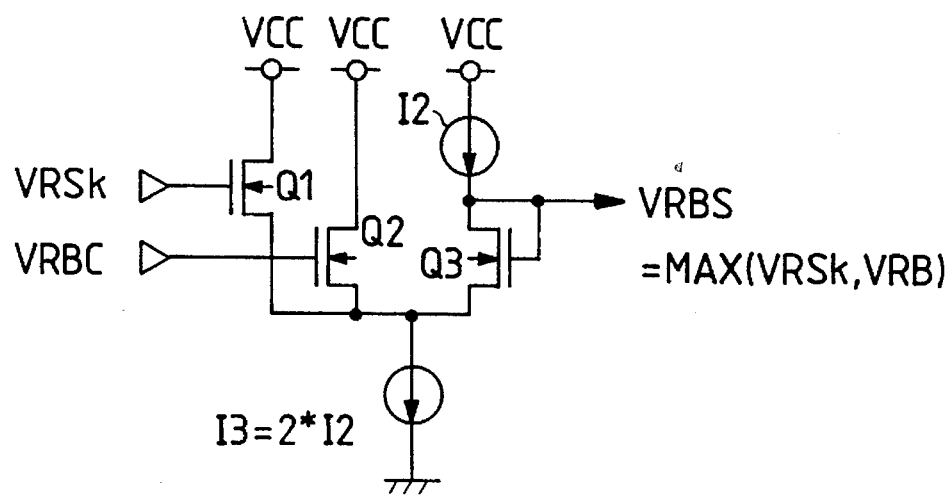
FIG. 13 is a circuit diagram illustrating a comparator of FIG. 11 practiced as one preferred embodiment of the invention.
Figure 14:
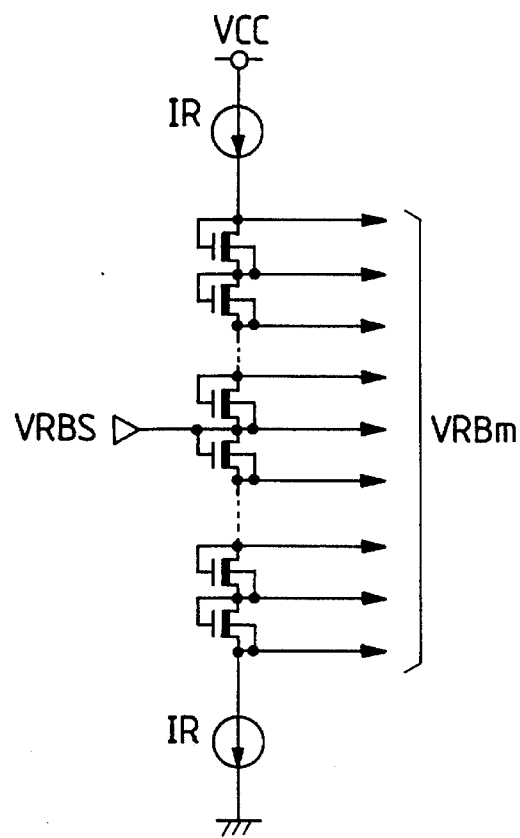
FIG. 14 is a circuit diagram illustrating a voltage divider of FIG. 11 practiced as one preferred embodiment of the invention.

Referring to FIG. 13, there is shown a circuit diagram of the above-mentioned comparator practiced as one embodiment of the invention. The above-mentioned voltages VRSk and VRBC are applied to gates of differentially arranged n-channel MOSFETs Q1 and Q2 respectively. An n-channel MOSFET Q3 is provided with its source made common with sources of the MOSFETs Q1 and Q2. The MOSFETs Q3 is made common at its gate and drain to flow a current of a constant current source I2. These MOSFETs Q1 through Q3 are equal in size. A constant current source I3 is provided to the common source of the MOSFETs Q1 through Q3. A current of the constant current source I3 is set to a value twice as high as the current of the constant current source I2. These constant current sources I2 and I3 are set to the above-mentioned current ratio based On the MOSFET size ratio by using a current mirror circuit based on the reference current source.

When the VRSk>VRBC, the MOSFET Q1 is turned on. Consequently, the same current I2 flows through the MOSFETs Q1 and Q3. This causes the voltage VRSk applied to the gate of the MOSFET Q1 to be outputted via the gate and source of the MOSFET Q1 and the source and gate of the MOSFET Q3. Conversely, if the VRSk<the VRBC, the MOSFET Q2 is turned on. Consequently, the same current I2 flows through the MOSFETs Q2 and Q3. This causes the voltage VRBC applied to the gate of the MOSFET Q2 to be outputted via the gate and source of the MOSFET Q2 and the source and gate of the MOSFET Q3. Thus, the output voltage VRBS is made equal to the higher of the two voltages VRSk and VRBC.

In FIG. 11, voltages VEG, VED, VEV, VWD, and VWV are formed from the above-mentioned divided voltage VRBm instead of the divided voltages VRSi and VRSI of FIG. 1. If the supply voltage VCC is raised over a certain level for life testing, these divided voltages of FIG. 11 become voltages that vary based on the reference voltage VRBC to be raised corresponding to the supply voltage VCC.

Figure 15A:
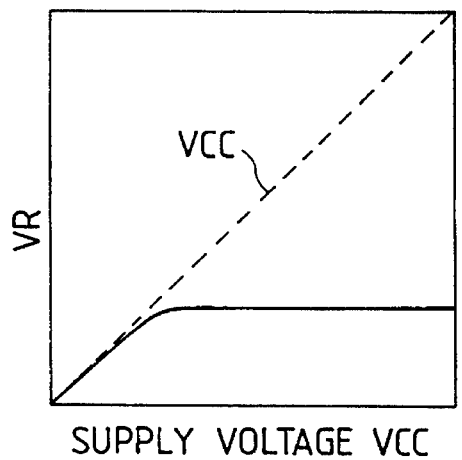
FIG. 15 (A) and (B) are voltage characteristics diagrams for describing the invention.
Figure 15B:
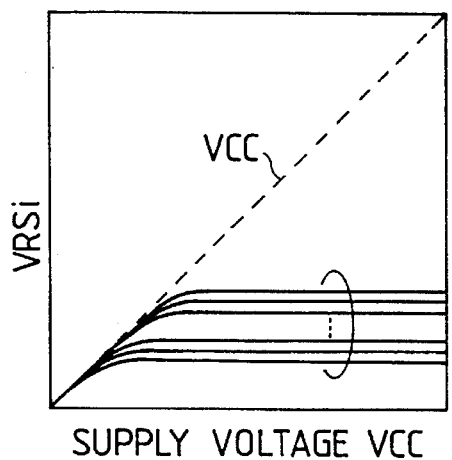
Figure 16:
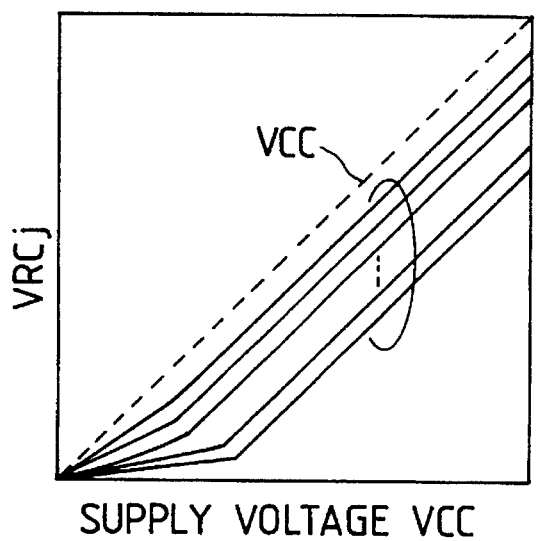
FIG. 16 is another voltage characteristics diagram for describing the invention.

Referring to FIGS. 15 and 16, there are shown voltage characteristics diagram. FIG. 15 (A) shows the voltage characteristic of the reference voltage VR. As shown, over an operating voltage, the reference voltage is constant regardless of the rise in the supply voltage VCC. FIG. 15 (B) shows the voltage characteristic of the divided voltage VRSi formed based on the reference voltage VR. The divided voltage VRSi consists of a plurality of voltages, each being constant corresponding to the circuit ground potential. FIG. 16 shows the voltage characteristic of the divided voltage VRCj formed based on the reference voltage VR. The divided voltage VRCj consists of a plurality of voltages, each being constant corresponding to the supply voltage VCC.

Figure 17A:
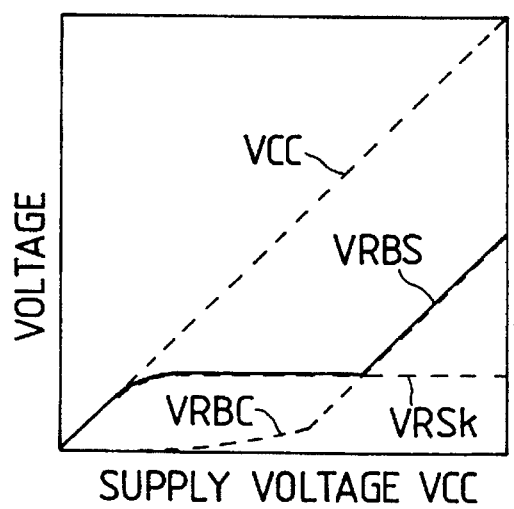
FIG. 17 (A) and (B) are other voltage characteristics diagrams for describing the invention.
Figure 17B:
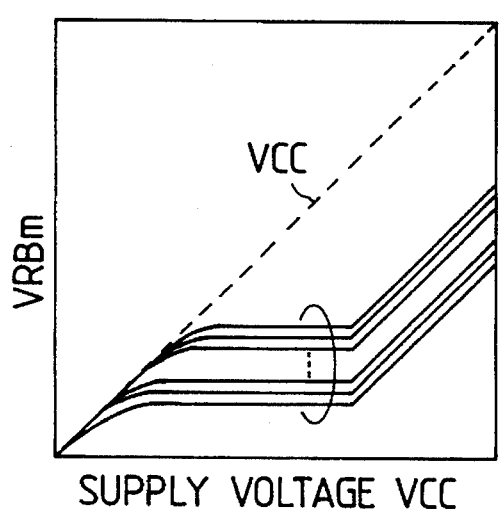
Figure 18:
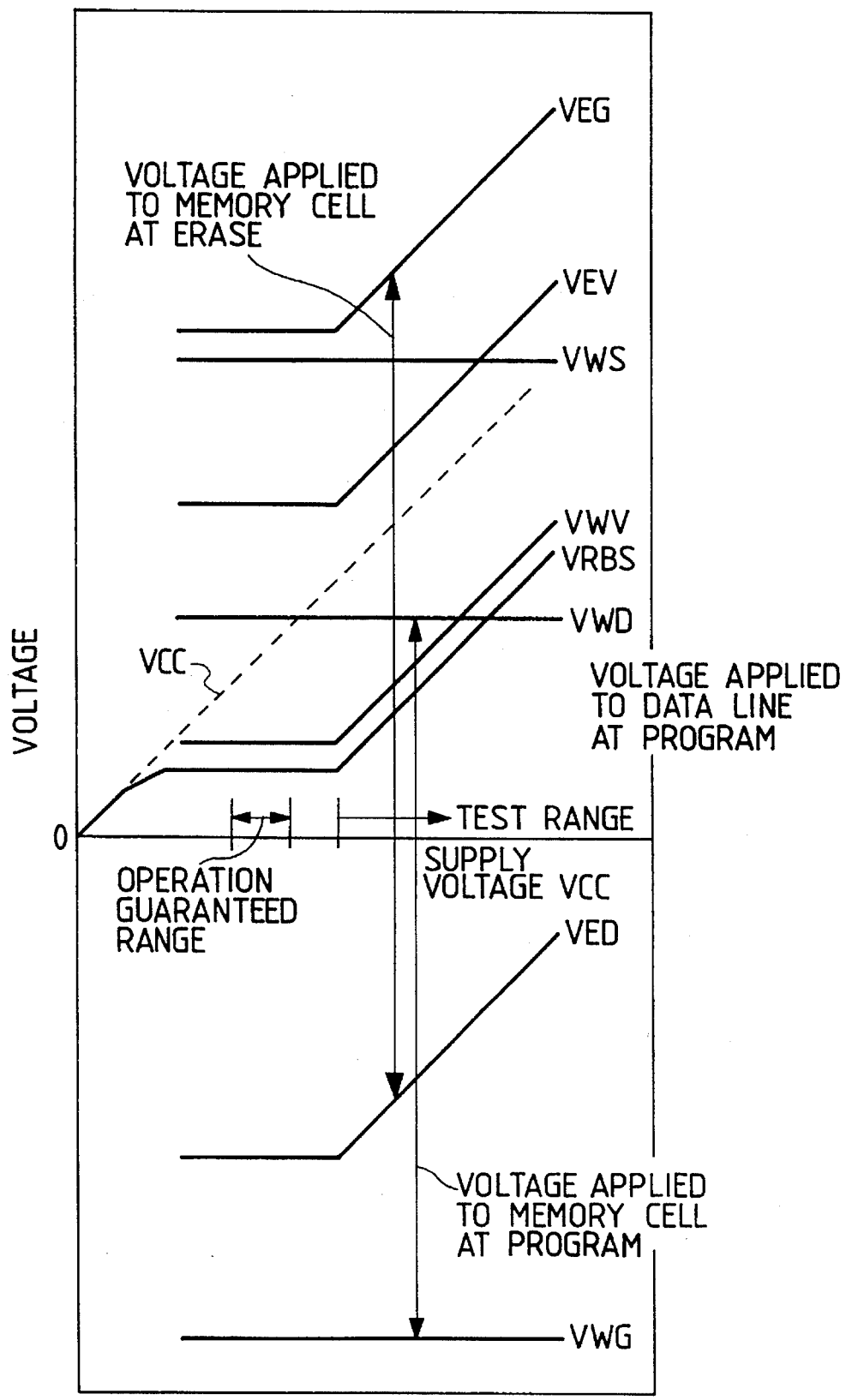
FIG. 18 is a voltage characteristics diagram for describing operations of the flash memory associated with the invention.

Referring to FIG. 17, there are shown voltage characteristics of the reference voltage generator at life testing of FIG. 11. As shown in FIG. 17 (A), when the supply voltage VCC reaches the operating voltage, the voltage VRBC varies accordingly. Because the above-mentioned reference voltage VRSk is constant, the reference voltage VRBS to be outputted around the inversion of potential relationships due to the rise in the supply voltage VCC is switched from the VRSk to the VRBC. In FIG. 17 (B), based on the above-mentioned switching, the divided voltage VRBm is switched over a certain voltage from a Constant voltage to a voltage dependent on the supply voltage VCC.

Referring to FIG. 8, there is shown voltage characteristics for describing operations of a collectively erasable EEPROM (flash memory) using the voltage generator of FIG. 11. In an operation guaranteed range with the supply voltage being relatively low, each voltage is set so that the voltage has a constant relationship with a variation of the supply voltage.

When the supply voltage VCC is raised over the above-mentioned operation guaranteed range and a test range is reached, each voltage rises in proportion to the rise in the supply voltage VCC. At this moment, a voltage VWD applied to data line and a control gate potential VWG for program are kept constant. This is because the program voltage cannot be held constant unless the VWD is held constant since the memory cell gate voltage at program is constant. Meanwhile, a voltage for erasure is set so that an erase operation is performed at a voltage similar to one in the operation guaranteed range by maintaining constant the a relationship of the VEG and VED to the supply voltage VCC.

TABLE 1

| Supply voltage | At normal operation | | | | At life test | | Remarks |
|---|---|---|---|---|---|---|---|
| | Setting value | VR1 | n | VR2 | VR2 | Setting value | |
| VCC | 3-3.6 | | | | | 6.5 | |
| VEG | 12.0 | 1.5 | 7 | 1.5 | 3.5 | 14.0 | |
| VED | -4.0 | -1.6 + VCC | 3 | 0.8 | 2.8 | -2.0 | |
| VEG-VED | 16.0 | | | | | 16.0 | Erase voltage |
| VEV | 5.3 | 1.7 | 2 | 1.9 | 3.9 | 7.3 | |
| VWG | -9.5 | -1.5 + VCC | 7 | 1.0 | 1.0 | -9.5 | |
| VWD | 4.5 | | | | | 4.5 | Write data line |
| VWD-VWG | 14.0 | | | | | 14.5 | Write voltage |
| VWV | 1.5 | | | 1.5 | 3.5 | 3.5 | |
| VWS | 7.2 | 1.4 | 4 | 1.6 | 1.6 | 7.2 | |

Table 1 lists actual setting values of the above-mentioned voltages. The reference voltages VR1 and VR2 and n correspond to the reference voltages and the number of stages of series MOSFETs in FIG. 4 and FIG. 5. Numerals 3–3.6 of the supply voltage VCC mean 3.0 V to 3.6 V.

From the above-mentioned embodiments of the invention, following effects are obtained:

(1) The charge pump circuit for forming a step-up voltage higher than a desired voltage adding is intermittently operated so that the desired internal voltage is obtained by adding a voltage obtained by multiplying a particular voltage among a plurality of divided voltages formed based on a reference voltage by n to a predetermined divided voltage, thereby efficiently forming any stable voltages.

(2) For a circuit for forming the above-mentioned desired internal voltage obtained by adding the two voltages, a MOSFET applied at its gate with the above-mentioned adjusting divided voltage is provided in the n MOSFET diodes provided between the output terminal of the charge pump circuit and the ground potential or supply voltage of the voltage generator and a MOSFET diode is inserted in series to match its drain voltage with the reference voltage. This simple constitution of the MOSFETs diodes and the voltage comparator can form any desired voltages.

(3) The above-mentioned voltage generator is used to provide desired supply voltages by operating the charge pump circuit intermittently, thereby contributing to power saving.

(4) A threshold voltage difference between the enhancement-type MOSFET and the depletion-type MOSFET is used and fine adjustment is performed based on the size ratio between these MOSFETs, thereby providing the desired reference voltage with precision against process dispersion.

(5) For a reference voltage to be put in the above-mentioned voltage comparator, a voltage selected, by the select signal formed by detecting whether the fuse has been blown or not, from among the divided voltages formed by the above-mentioned voltage divider is used, thereby providing a desired voltage with precision including process dispersion.

(6) The above-mentioned reference voltage generator includes a reference voltage generator for life testing based on the supply voltage and, when the supply voltage is raised over a predetermined voltage, the reference voltage for life testing is used, thereby efficiently providing troubleshooting of initial faults.

(7) In a memory cell, an erase operation is performed by injecting a charge from the substrate side to the floating gate via the tunnel insulating film based in the relative potential relationship between the control gate and the substrate. Based on the above-mentioned relative potential relationship between the control gate and the substrate, the charge is discharged from the floating gate to the drain side via the above-mentioned tunnel insulating film for a program operation. For a collectively erasable nonvolatile memory circuit composed of such memory cells, the charge pump circuit for forming a step-up voltage higher than a desired internal voltage is intermittently operated as a power supply circuit for forming a plurality of voltages required for programming, erasing and reading data with such memory cells. The charge pump circuit is operated so that the desired internal voltage is obtained by adding a voltage obtained by multiplying a particular voltage among the plurality of divided voltages formed based on the reference voltage by n to a predetermined divided voltage. This constitution can efficiently form a variety types of voltages.

(8) The reference voltage generator for life testing based on a supply voltage as the reference voltage is provided. When the supply voltage is raised over a predetermined voltage, the reference voltage for life testing is used. A memory cell application voltage at erase and program operations in the life testing is varied relative to the above-mentioned supply voltage to form a constant voltage. This constitution permits the program and erase operations while performing an acceleration test.

While the preferred embodiments of the present invention have been described using specific terms, such description is for illustrative purposes only, and it is to be understood that changes and variations may be made without departing from the spirit or scope of the appended claims. For example, the controller for intermittently operating the charge pump circuit may be any controller that performs control so that the output voltage provides the desired voltage based on the above-mentioned reference voltage. Further, the constitution of the memory cells constituting the flash memory may be any if the erase and program operations are made by the tunnel current as described above.

This invention is widely applicable to any semiconductor integrated circuit devices that require a variety of internal voltages.

The following describes effects to be obtained by typical inventions disclosed herein. The charge pump circuit for forming a step-up voltage higher than a desired voltage adding is intermittently operated so that the desired internal voltage is obtained by adding a voltage obtained by multiplying a particular voltage among a plurality of divided voltages formed based on a reference voltage by n to a predetermined divided voltage, thereby efficiently forming any stable voltages.

For a circuit for forming the above-mentioned desired internal voltage obtained by adding the two voltages, a MOSFET applied at its gate with the above-mentioned adjusting divided voltage is provided in the n MOSFET diodes provided between the output terminal of the charge pump circuit and the ground potential or supply voltage of the voltage generator and a MOSFET diode is inserted in series to match its drain voltage with the reference voltage.

This simple constitution of the MOSFETs diodes and the voltage comparator can form any desired voltages.

The above-mentioned voltage generator is used to provide desired supply voltages by operating the charge pump circuit intermittently, thereby contributing to power saving.

A threshold voltage difference between the enhancement-type MOSFET and the depletion-type MOSFET is used and fine adjustment is performed based on the size ratio between these MOSFETs, thereby providing the desired reference voltage with precision against process dispersion.

For a reference voltage to be put in the above-mentioned voltage comparator, a voltage selected, by the select signal formed by detecting whether the fuse has been blown or not, from among the divided voltages formed by the above-mentioned voltage divider is used, thereby providing a desired voltage with precision including process dispersion.

The above-mentioned reference voltage generator includes a reference voltage generator for life testing based on the supply voltage and, when the supply voltage is raised over a predetermined voltage, the reference voltage for life testing is used, thereby efficiently providing troubleshooting of initial faults.

In a memory cell, an erase operation is performed by injecting a charge from the substrate side to the floating gate via the tunnel insulating film based in the relative potential relationship between the control gate and the substrate. Based on the above-mentioned relative potential relationship between the control gate and the substrate, the charge is discharged from the floating gate to the drain side via the above-mentioned tunnel insulating film for a program operation. For a collectively erasable nonvolatile memory circuit composed of such memory cells, the charge pump circuit for forming a step-up voltage higher than a desired internal voltage is intermittently operated as a power supply circuit for forming a plurality of voltages required for writing, erasing and reading data with such memory cells. The charge pump circuit is operated so that the desired internal voltage is obtained by adding a voltage obtained by multiplying a particular voltage among the plurality of divided voltages formed based on the reference voltage by n to a predetermined divided voltage. This constitution can efficiently form a variety types of voltages.

The reference voltage generator for life testing based on a supply voltage as the reference voltage is provided. When the supply voltage is raised over a predetermined voltage, the reference voltage for life testing is used. A memory cell application voltage at erase and program operations in the life testing is varied relative to the above-mentioned supply voltage to form a constant voltage. This constitution permits the program and erase operations while performing an acceleration test.

What is claimed is:

1. A flash memory comprising:

a memory array wherein memory cells are disposed at intersections between a word line and a data line in a matrix, said memory cells being erased by injecting an electric charge from a substrate into a floating gate via a tunnel insulating film based on a relative potential relationship between a control gate and said substrate and programmed by discharging the electric charge from the floating gate into a drain via said tunnel insulating film based on a relative potential relationship between said control gate and said drain; and a power supply circuit which forms a plurality of voltages necessary for programming, erasing, and reading said memory cells, wherein said power supply circuit comprises:

a reference voltage generating circuit which generates a reference voltage;

a voltage dividing circuit which forms a plurality of divided voltages based on said reference voltage;

a voltage supply circuit which outputs a desired internal voltage by adding a voltage obtained by multiplying one of said plurality of divided voltages by n to a predetermined divided voltage selected from said plurality of divided voltages for fine voltage adjustment, wherein said voltage supply circuit includes:

a charge pump circuit, n first metal-oxide semiconductor field-effect transistors each having a diode connection and disposed in series between an output terminal of said charge pump circuit and one of a ground potential and a supply voltage, a voltage comparator which receives said one of said plurality of divided voltages and a drain or source voltage of a second metal-oxide semiconductor field-effect transistor coupled to one of said ground potential and supply voltage, and a gate circuit which limits an input pulse to be supplied to said charge pump circuit by an output voltage of said voltage comparator, wherein one of said first metal-oxide semiconductor field-effect transistors that is inserted in said n metal-oxide semiconductor field-effect transistors in series is applied at a gate thereof with said predetermined divided voltage.

2. A flash memory according to claim 1, further comprising a second reference voltage generating circuit for generating a test reference voltage which is higher than said reference voltage during a life test.

3. A semiconductor integrated circuit device comprising:

a reference voltage generating circuit which generates a reference voltage;

a voltage dividing circuit which forms a plurality of divided voltages based on said reference voltage; and a power supply circuit which outputs a desired internal voltage by adding a voltage obtained by multiplying one of said plurality of divided voltages by n to a predetermined divided voltage selected from said plurality of divided voltages for fine voltage adjustment, wherein said power supply circuit includes:

a charge pump circuit, n first metal-oxide semiconductor field effect transistors each having a diode connection and disposed in series between an output terminal of said charge pump circuit and one of a ground potential and a supply voltage, a voltage comparator which receives said one of said plurality of divided voltages and a drain or source voltage of a second metal-oxide semiconductor field-effect transistor coupled to one of said ground potential and supply voltage, and a gate circuit which limits an input pulse to be supplied to said charge pump circuit by an output voltage of said voltage comparator, wherein one of said first metal-oxide semiconductor field-effect transistors that is inserted in said n metal-oxide semiconductor field-effect transistors in series is applied at a gate thereof with said predetermined divided voltage.

4. A semiconductor integrated circuit device according to claim 3, wherein said second metal-oxide semiconductor field-effect transistor also has a diode connection and is connected in series with said n first metal-oxide semiconductor field-effect transistors.

5. A semiconductor integrated circuit device according to claim 4, wherein said second metal-oxide semiconductor field-effect transistor is coupled in series between said n first metal-oxide semiconductor field-effect transistors and one of said ground potential and said supply voltage.

6. A semiconductor integrated circuit device according to claim 3, further comprising a control circuit which intermittently operates said power supply circuit.

7. A semiconductor integrated circuit device according to claim 6, wherein said control circuit includes a voltage comparator having one input coupled to the output of the power supply circuit and another input coupled to receive a reference voltage, wherein said control circuit turns said power supply circuit on and off to maintain a predetermined constant output voltage for said power supply circuit.

8. A flash memory according to claim 1, further comprising a control circuit which intermittently operates said voltage supply circuit.

9. A flash memory according to claim 8, wherein said control circuit includes a voltage comparator having one input coupled to the output of the voltage supply circuit and another input coupled to receive a reference voltage, wherein said control circuit turns said voltage supply circuit on and off to maintain a predetermined constant output voltage for said voltage supply circuit.

10. A semiconductor integrated circuit device according to claim 3, wherein said reference voltage generating circuit generates said reference voltage on the basis of a threshold voltage difference between an enhancement-type metal-oxide semiconductor field-effect transistor and a depletion-type metal-oxide semiconductor field-effect transistor, said reference voltage generating circuit being fine-adjusted based on a size ratio between said enhancement-type metal-oxide semiconductor field-effect transistor and said depletion-type metal-oxide semiconductor field-effect transistor.

11. A semiconductor integrated circuit device according to claim 3, wherein the reference voltage to be applied to said voltage comparator is a voltage selected by a select signal formed by detection of whether a fuse has been blown from among the plurality of divided voltages formed by said voltage dividing circuit.

12. A semiconductor integrated circuit device according to claim 3, further comprising a second reference voltage generating circuit for generating a test reference voltage which is higher than said reference voltage during a life test.

\* \* \* \* \*